(12) United States Patent
Chen et al.

(10) Patent No.: US 6,692,983 B1
(45) Date of Patent: Feb. 17, 2004

(54) METHOD OF FORMING A COLOR FILTER ON A SUBSTRATE HAVING PIXEL DRIVING ELEMENTS

(76) Inventors: Chih-Chiang Chen, No. 77, Shu-Jen Rd., Luo-Teng Chen, Ilan Hsien, Taiwan, Ilan (TW); Ching-Sang Chuang, 19Fl.-2, No. 181, Wuling Rd., Hsinchu, Taiwan 300, Hsinchu (TW); Jiun-Jye Chang, No. 119, Rungan St., Chianjin Chiu, Kaohsiung, Taiwan 801, Kaohsiung (TW)

( * ) Notice: Subject to any disclaimer, the term of this patent is extended or adjusted under 35 U.S.C. 154(b) by 0 days.

(21) Appl. No.: 10/400,032

(22) Filed: Mar. 26, 2003

(30) Foreign Application Priority Data

Aug. 1, 2002 (TW) ........................................ 91117366 A

(51) Int. Cl.[7] ............................................... H01L 21/00
(52) U.S. Cl. ............................. 438/70; 73/149; 73/488; 73/725; 73/789
(58) Field of Search ............................. 438/57, 69, 70, 438/71, 73, 149, 151, 301, 725, 738, 584, 587, 761, 760, 789, 790, 787, 488; 257/59; 349/106

(56) References Cited

U.S. PATENT DOCUMENTS 5,818,550 A * 10/1998 Kadota et al. ................ 349/43
6,038,003 A * 3/2000 Kim ............................. 349/43
6,503,772 B1 * 1/2003 Ohtsu et al. ................. 438/149
2001/0025958 A1 * 10/2001 Yamazaki et al. ............. 257/72
2002/0037600 A1 * 3/2002 Hirabayashi et al. ......... 438/78
2003/0122980 A1 * 7/2003 Jin et al. ....................... 349/43
2003/0136971 A1 * 7/2003 Rhee et al. .................... 257/98

* cited by examiner

Primary Examiner—Savitri Mulpuri
(74) Attorney, Agent, or Firm—Troxell Law Office PLLC

(57) ABSTRACT

A method of forming a color filter on a substrate having pixel driving elements. A substrate having a plurality of light-transmitting areas and active areas is provided. A pixel driving element is formed on the substrate in each active area, wherein an insulation layer is formed between each pixel driving element. A planarization layer is formed on the pixel driving elements and the insulation layer. Part of the planarization layer is removed to form contact holes and openings, wherein the contact holes expose part of the pixel driving elements, and the openings expose the insulation layer in the light-transmitting areas. Color pigment is filled into the openings to form a color filter on the substrate having the pixel driving elements. Transparent pixel electrodes are formed in the contact holes to electrically connect the pixel driving elements, wherein the transparent electrodes extend onto part of the color filter.

14 Claims, 12 Drawing Sheets

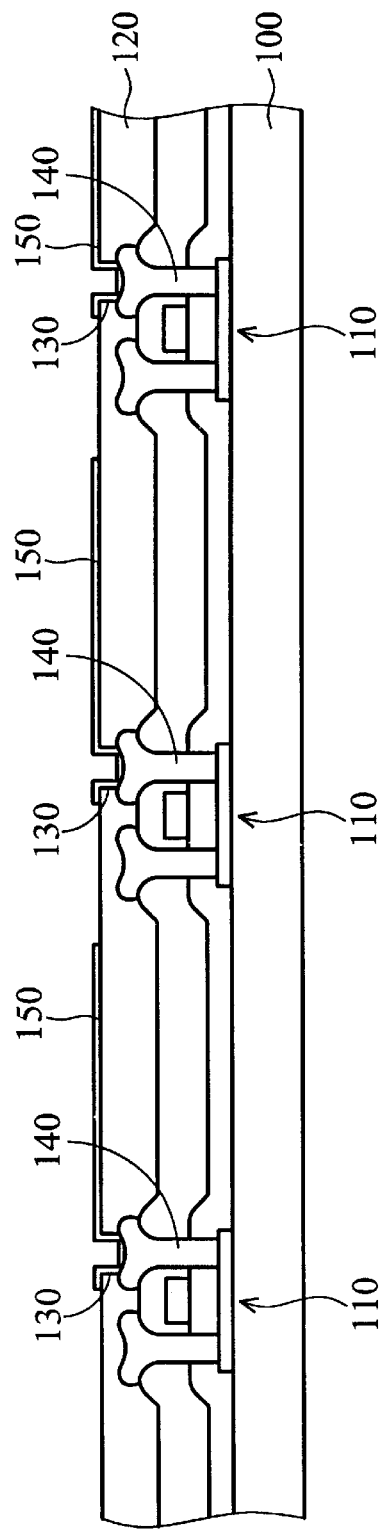
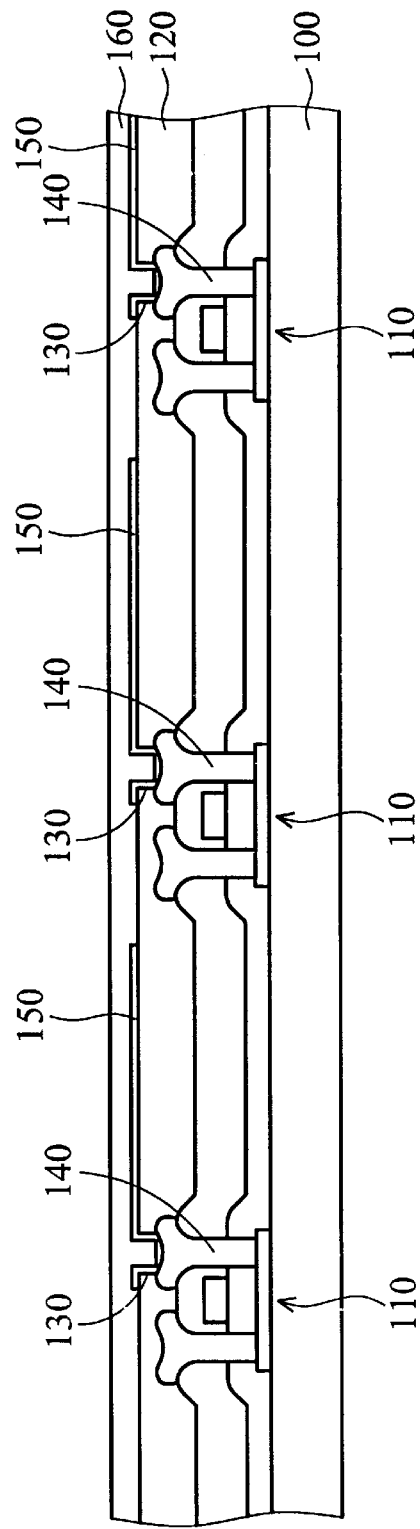
FIG. 1A (PRIOR ART)
FIG. 1B (PRIOR ART)

METHOD OF FORMING A COLOR FILTER ON A SUBSTRATE HAVING PIXEL DRIVING ELEMENTS

BACKGROUND OF THE INVENTION

1. Field of the Invention

The present invention relates to a color display process, and more particularly, to a method of forming a color filter on a substrate having a thin film transistor (TFT) array.

2. Description of the Related Art

In recent years, liquid crystal displays (LCDs) of active matrix systems using thin film transistors (TFTs) have become attractive as high quality display apparatuses. In order to display a color image in the LCD, it is necessary to provide color filters of red, green and blue (RGB) to serve as light sources for generating the three primary colors.

For example, in a color filter LCD for a liquid crystal projector or a color LCD for direct viewing of a single plate type using one pixel (liquid crystal panel), color filters of the respective colors are provided. Thus, the respective colors of RGB correspond to pixels in a one-to-one manner.

In this instance, when the color filters of the respective colors of RGB are provided in one pixel region, it is necessary to provide a black matrix made of a light shielding film between the color filters of the respective colors.

A conventional color filter is formed on a second substrate arranged in such a manner that the substrate faces a first substrate on which the pixel driving elements have been formed so as to sandwich a liquid crystal layer. When such a structure is applied, however, it is difficult to eliminate a relative positional deviation between the first and second substrates. Therefore, it is necessary to increase the width of the black matrix by only an amount corresponding to a precise alignment of the first and second substrates. Consequently, the area of color filter is reduced and the area of display electrode used for displaying is also decreased.

Accordingly, a structure in which the color filters are formed on the side of the substrate on which the pixel driving elements are formed has been proposed. The color filter with this structure is called an on-chip color filter (also referred to as a color filter on array, COA structure). When the on-chip color filter is applied, the drawback caused by the foregoing alignment of the substrates can be avoided.

FIGS. 1A~1C show an example of previously proposed on-chip color filter processes disclosed in U.S. Pat. No. 6,162,544. In FIG. 1A, thin film transistor (TFT) structures 110 are formed on a glass substrate 100. A first planarization layer 120 is formed on the TFT structures 110. Contact windows 130 through the first planarization layer 120 are formed to expose a drain electrode 140 of each TFT structure 110. A transparent pixel electrode 150 is formed in each contact window 130 to electrically connect the drain electrode 140. Also, the pixel electrode 150 is extended on part of the first planarization layer 120.

In FIG. 1B, a second planarization layer 160 is formed to cover the pixel electrodes 150.

In FIG. 1C, a color filter 170 is formed on the second planarization layer 160 by, for example, a pigment dispersion method.

Nevertheless, the method of the prior art has some drawbacks that are described as follows:

(1). The steps of forming the contact windows 130, the pixel electrodes 150, and the color filter 170 require the performance of photolithography processes, thus, the fabrication of the conventional method is costly and complex.

(2). Because the color filter 170 is formed on the second planarization layer 160, the second planarization layer 160 must be transparent and have a small dielectric constant so that a coupling capacitor need not be formed between the color filter 170 and the pixel electrodes 150. Thus, the material selection of the second planarization layer 160 is difficult and the material cost of the second planarization layer 160 is high.

SUMMARY OF THE INVENTION

The object of the present invention is to provide a method of forming a color filter on a substrate having pixel driving elements.

Another object of the present invention is to provide a method of applying an inkjet method in a LCD process.

In order to achieve these objects, the present invention provides a method of forming a color filter on a substrate having pixel driving elements. A substrate having a plurality of light-transmitting areas and active areas is provided. A pixel driving element is formed on the substrate in each active area, wherein an insulation layer is formed between each pixel driving element and on the substrate in the light-transmitting areas. A planarization layer is formed on the pixel driving elements and the insulation layer. Part of the planarization layer is removed to form a plurality of contact holes and openings, wherein the contact holes expose part of the surface of the pixel driving elements, and the openings expose the surface of the insulation layer in the light-transmitting areas. At least one color pigment is filled into the openings to form a color filter on the substrate having the pixel driving elements. Transparent pixel electrodes are formed in the contact holes to electrically connect the pixel driving elements, wherein the transparent electrodes extend onto part of the color filter.

The present invention improves on the prior art in that the present method simultaneously forms the contact holes and the openings in the planarization layer, and then fills the color pigment into the openings to form a non-chip color filter. Thus, the invention forms the color filter without performing extra photolithography, thereby reducing costs and ameliorating the disadvantages of the prior art.

BRIEF DESCRIPTION OF THE DRAWINGS

The present invention can be more fully understood by reading the subsequent detailed description in conjunction with the examples and references made to the accompanying drawings, wherein:

FIGS. 1A~1C are sectional views of a on-chip color filter process of the prior art;

DETAILED DESCRIPTION OF THE INVENTION

First Embodiment

FIGS. 2A~2E are sectional views of a first embodiment of the on-chip color filter process according to the present invention.

Figure 1C:
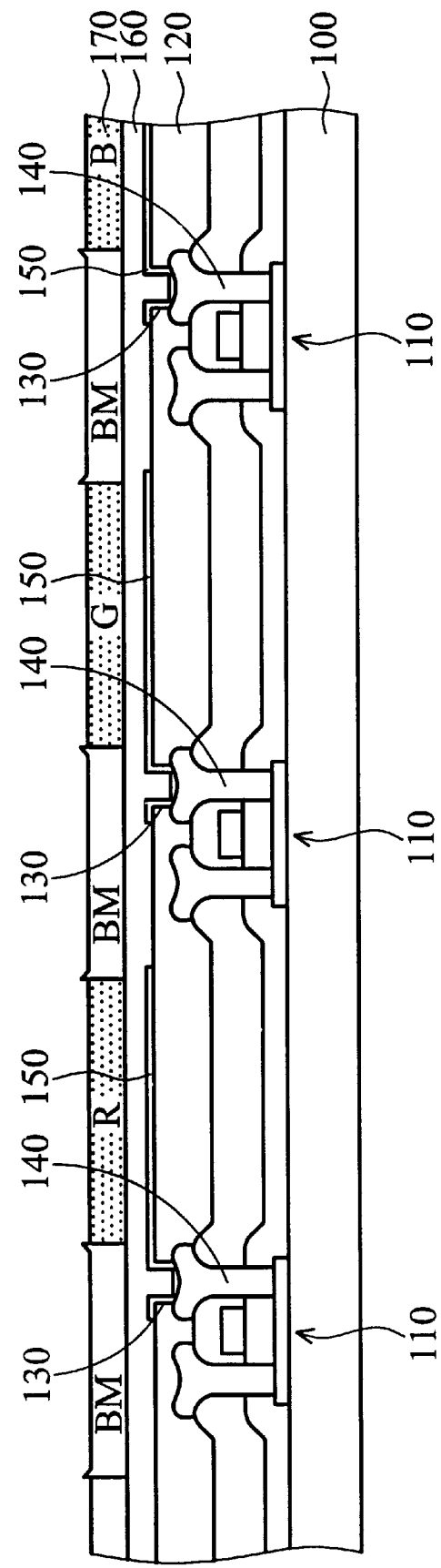
Figure 2A:
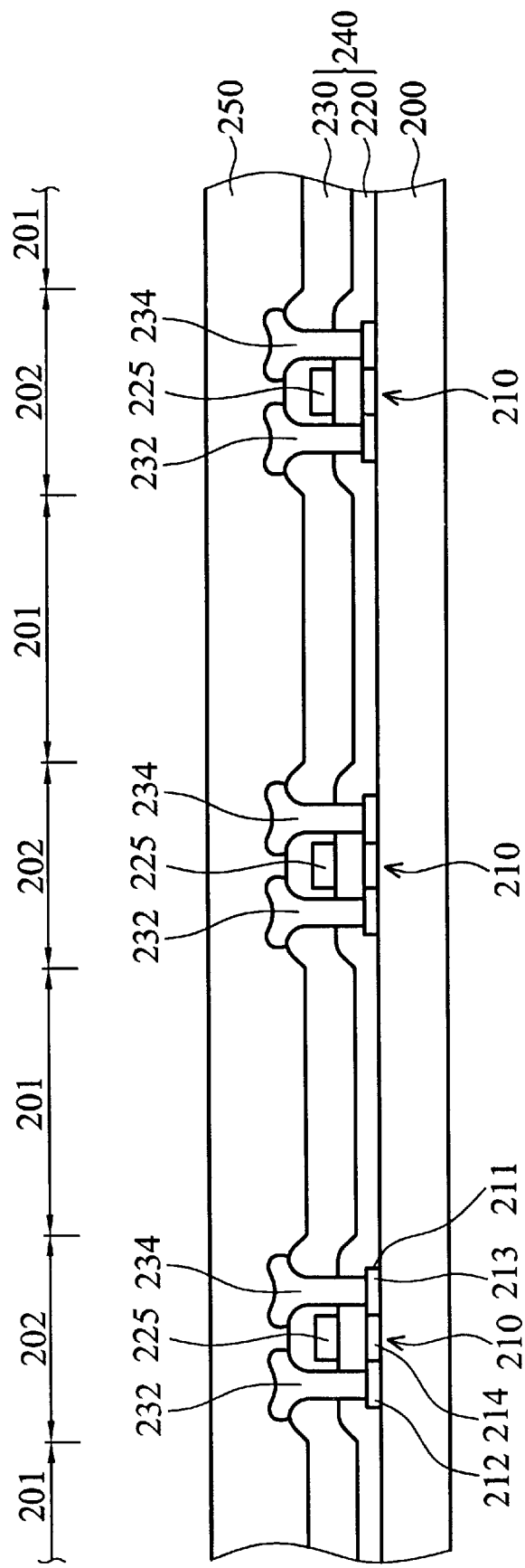
FIGS. 2A~2E are sectional views of a first embodiment of the on-chip color filter process according to the present invention.

In FIG. 2A, a substrate 200 having a plurality of light-transmitting areas 201 and active areas 202 is provided. The substrate 200 can be a transparent glass substrate or a transparent flexible substrate. Then, a pixel driving element 210 is formed on the substrate 200 in each active area 202, wherein an insulation layer 240 is formed between each of the pixel driving elements 210 and on the substrate 200 in the light-transmitting areas 201. The pixel driving element 210 can be a thin film transistor (TFT). The insulation layer 240 can be $SiO_2$ or SiN.

As a demonstrative example of forming the pixel driving element 210 on the substrate 200, referring to FIG. 2A, a polysilicon layer 211 is formed on part of the substrate 200. A gate insulating film 220 is formed on the polysilicon layer 211. A gate electrode 225 is formed on part of the gate insulating film 220. Using the gate electrode 225 as a mask, impurities are doped into part of the polysilicon layer 211 by implantation to form a source region 212 and a drain region 213. The pixel driving element 210, such as a TFT 210, is constructed by the source/drain regions 212, 213 and the gate electrode 225. The symbol 214 indicates a channel between the source region 212 and a drain region 213.

An interlayer insulating film 230 is formed on the entire surface of the TFTs 210. The source region 212 is connected to a source electrode 232 through a contact hole formed in the gate insulating film 220 and the interlayer insulating film 230. The drain region 213 is connected to a drain electrode 234 through a contact hole formed in the gate insulating film 220 and the interlayer insulating film 230. Thus, the insulation layer 240 is composed of the gate insulating film 220 and the interlayer insulating film 230.

In FIG. 2A, a planarization layer 250 is formed on the pixel driving elements 210 and the insulation layer 240. The planarization layer 250 can be transparent, and consist of $SiO_2$ or organic high polymer. The planarization layer 250 can be a photo-defined type or etch-defined type layer. It is preferred that the planarization layer 250 is photosensitive organic high polymer. It is highly preferable that the planarization layer 250 be a light shielding material, such as black resin, because the opaque planarization layer 250 is able to serve as a black matrix layer.

Figure 2B:
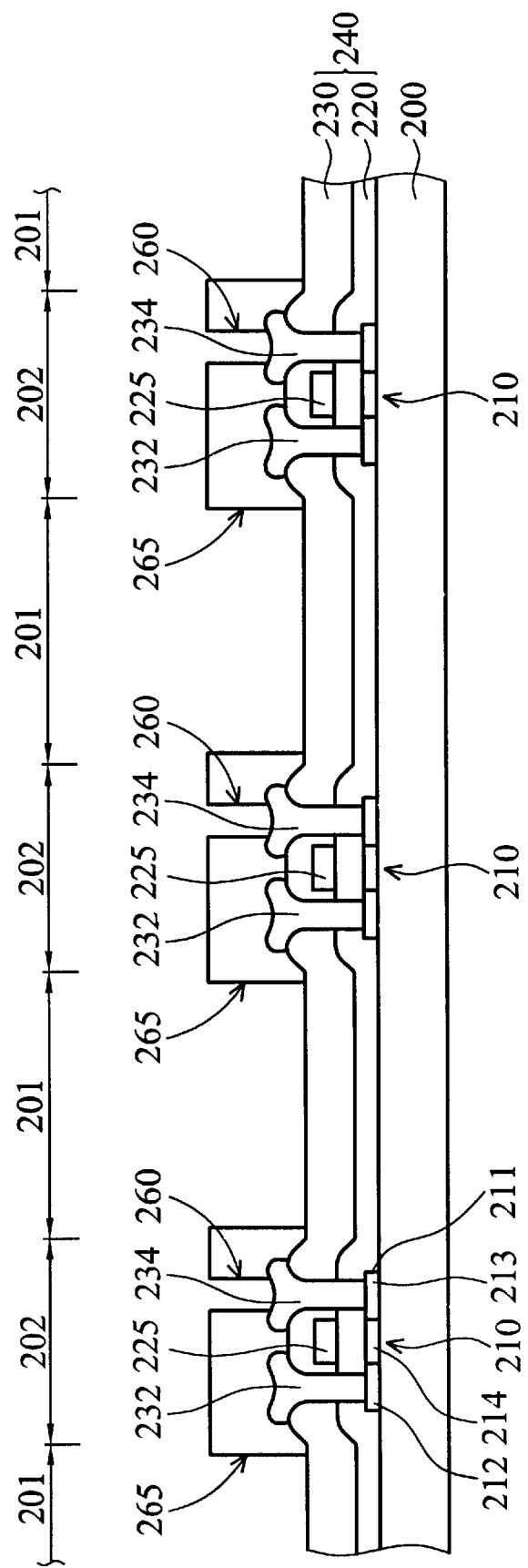

In FIG. 2B, part of the planarization layer 250 is removed to form a plurality of contact holes 260 and openings 265, wherein the contact holes 260 expose part of the surface of the pixel driving elements 210, and the openings 265 expose the surface of the insulation layer 240 in the light-transmitting areas 201.

Figure 2C:
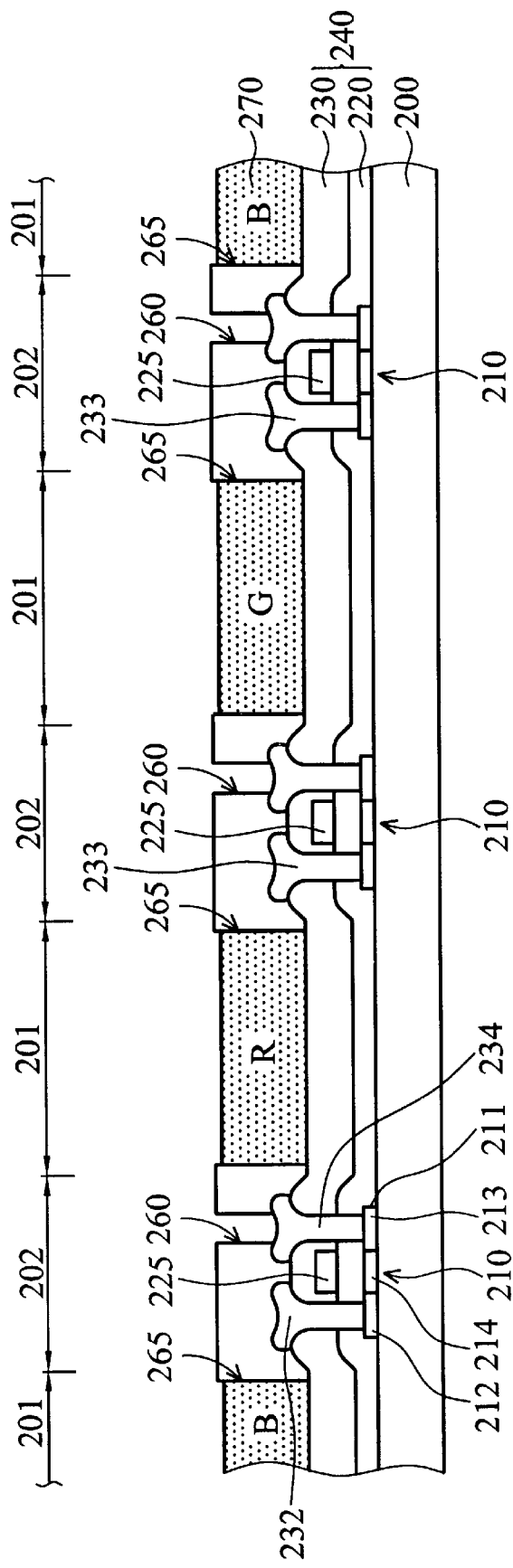

In FIG. 2C, an inkjet method is performed and at least one color pigment (also called color resist) is filled into the openings 265 to form a color filter 270 on the substrate 200 having the pixel driving elements 210 by, for example, nozzle(s). The colors of the color pigment can include red, green and blue. In this embodiment, it should be noted that when the planarization layer 250 is opaque, the color filter 270 includes red regions (R), green regions (G), blue regions (B) and a black matrix between the respective colors.

Figure 2D:
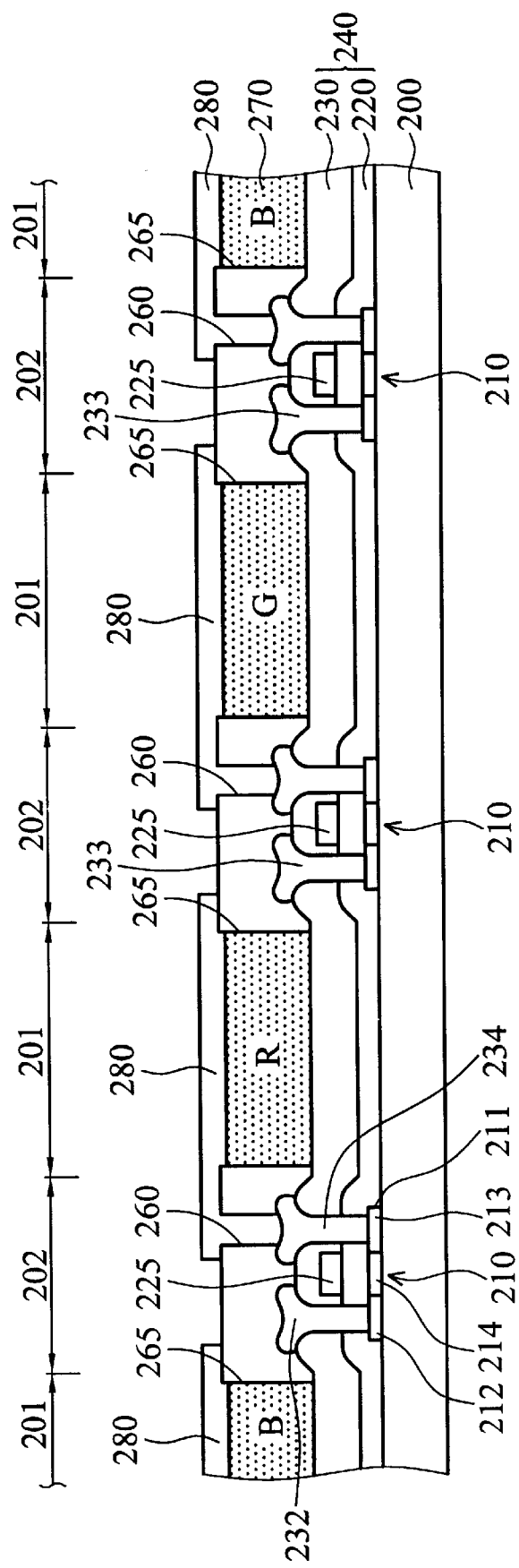

In FIG. 2D, transparent pixel electrodes 280 are formed in the contact holes 260 to electrically connect the pixel driving elements 210, wherein the transparent electrodes 280 extend onto part of the color filter 270. The transparent pixel electrode 280 can be indium tin oxide (ITO).

Figure 2E:
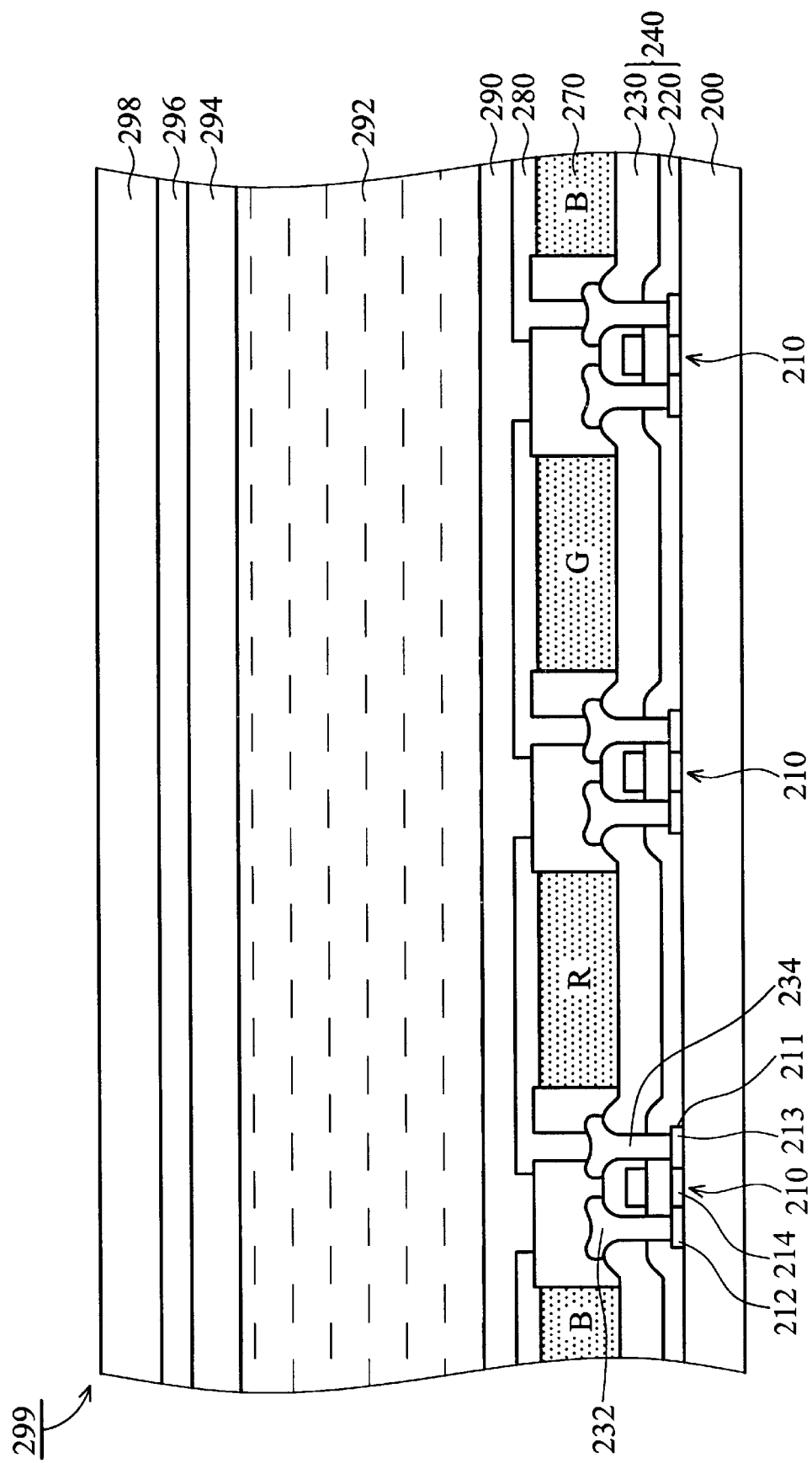

Moreover, a first orientation film 290 is formed on the color filter 270 and the transparent pixel electrodes 280. Then, a transparent insulation substrate 298, such as glass, is provided. A common electrode 296 is formed on the inner side of the substrate 298. A second orientation film 294 is formed on the common electrode 296. Next, a liquid crystal layer 292 in which liquid crystal has been filled is formed between transparent insulation substrates 298 and 200 which face each other. That is, the liquid crystal layer 292 is sandwiched between the orientation films 294 and 290. Thus, a LCD apparatus 299 is obtained, as shown in FIG. 2E.

Second Embodiment

FIGS. 3A~3E are sectional views of a second embodiment of the on-chip color filter process according to the present invention.

Figure 3A:
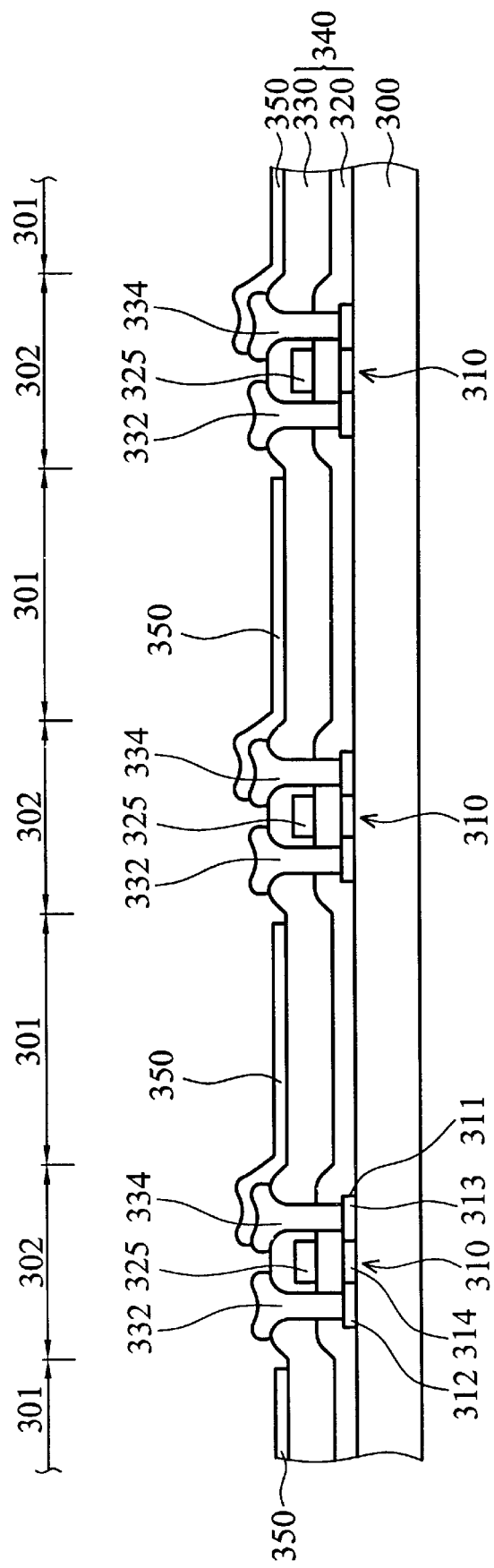
FIGS. 3A~3E are sectional views of a second embodiment of the on-chip color filter process according to the present invention.

In FIG. 3A, a substrate 300 having a plurality of light-transmitting areas 301 and active areas 302 is provided. The substrate 300 can be a transparent glass substrate or a transparent flexible substrate. Then, a pixel driving element 310 is formed on the substrate 300 in each active area 302, wherein an insulation layer 340 is formed between each of the pixel driving elements 310 and on the substrate 300 in the light-transmitting areas 301. The pixel driving element 310 can be a thin film transistor (TFT). The insulation layer 340 can be $SiO_2$ or SiN.

As a demonstrative example of forming the pixel driving element 310 on the substrate 300, referring to FIG. 3A, a polysilicon layer 311 is formed on part of the substrate 300. A gate insulating film 320 is formed on the polysilicon layer 311. A gate electrode 325 is formed on part of the gate insulating film 320. Using the gate electrode 325 as a mask, impurities are doped into part of the polysilicon layer 311 by implantation to form a source region 312 and a drain region 313. The pixel driving element 310, such as a TFT 310, is constructed by the source/drain regions 312, 313 and the gate electrode 325. The symbol 314 indicates a channel between the source region 312 and a drain region 313.

An interlayer insulating film 330 is formed on the entire surface of the TFT 310. The source region 312 is connected to a source electrode 332 through a contact hole formed in the gate insulating film 320 and the interlayer insulating film 330. The drain region 313 is connected to a drain electrode 334 through a contact hole formed in the gate insulating film 320 and the interlayer insulating film 330. Thus, the insulation layer 340 is composed of the gate insulating film 320 and the interlayer insulating film 330.

In FIG. 3A, transparent pixel electrodes 350 are formed on part of the insulation layer 340 and electrically connect the pixel driving elements 310. The transparent pixel electrode 350 can be indium tin oxide (ITO).

Figure 3B:
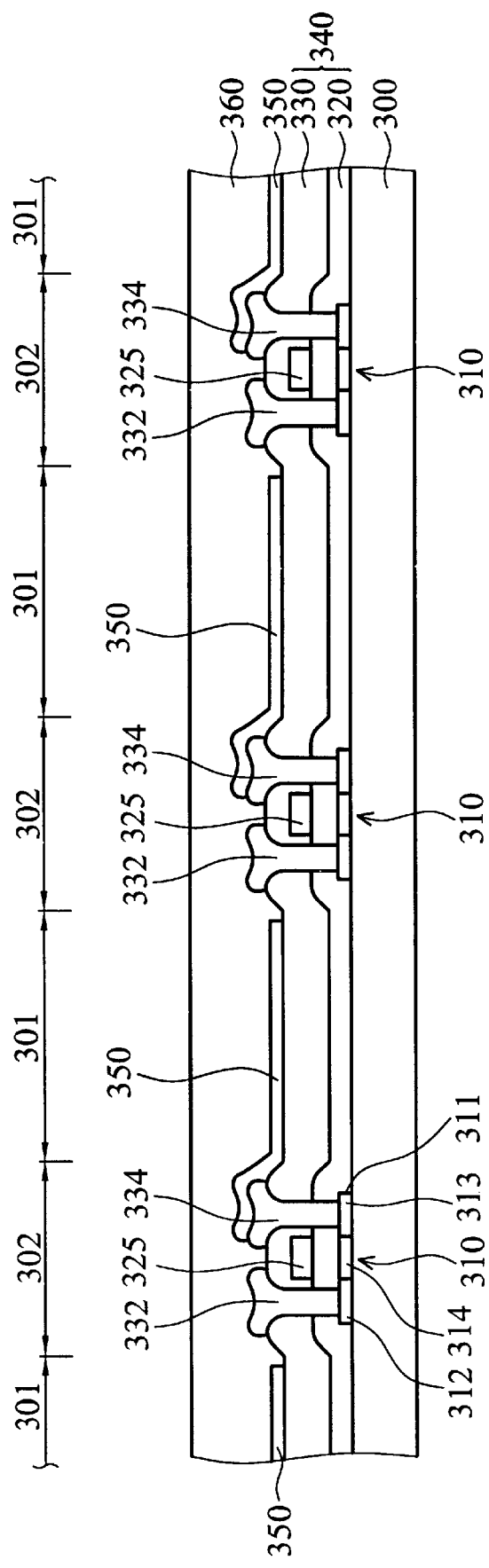

In FIG. 3B, a planarization layer 360 is formed on the pixel driving elements 310 and the transparent pixel electrodes 350. The planarization layer 360 can be transparent, and consist of $SiO_2$ or organic high polymer. The planarization layer 250 can be a photo-defined type or etch-defined type layer. It is preferred that the planarization layer 360 is photosensitive organic high polymer. It is highly preferable that the planarization layer 360 be a light shielding material, such as black resin, because the opaque planarization layer 360 is able to serve as a black matrix layer.

Figure 3C:
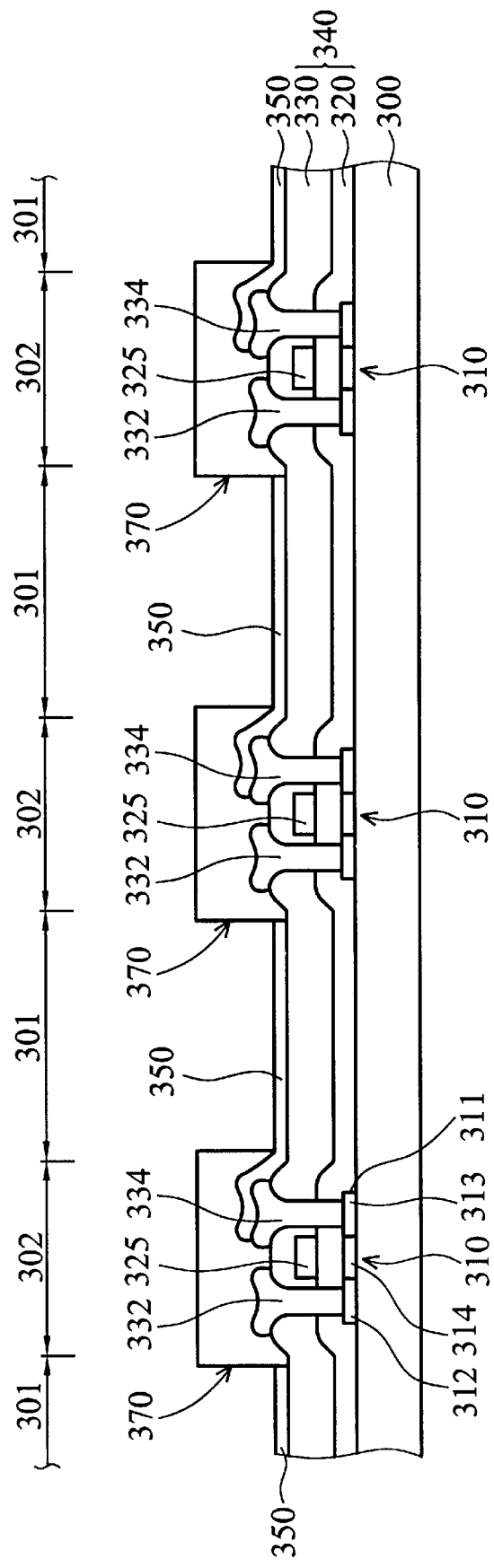

In FIG. 3C, part of the planarization layer 360 is removed to form a plurality of openings 370, wherein the openings 370 expose the surface of the transparent pixel electrodes 350 in the light-transmitting areas 301.

Figure 3D:
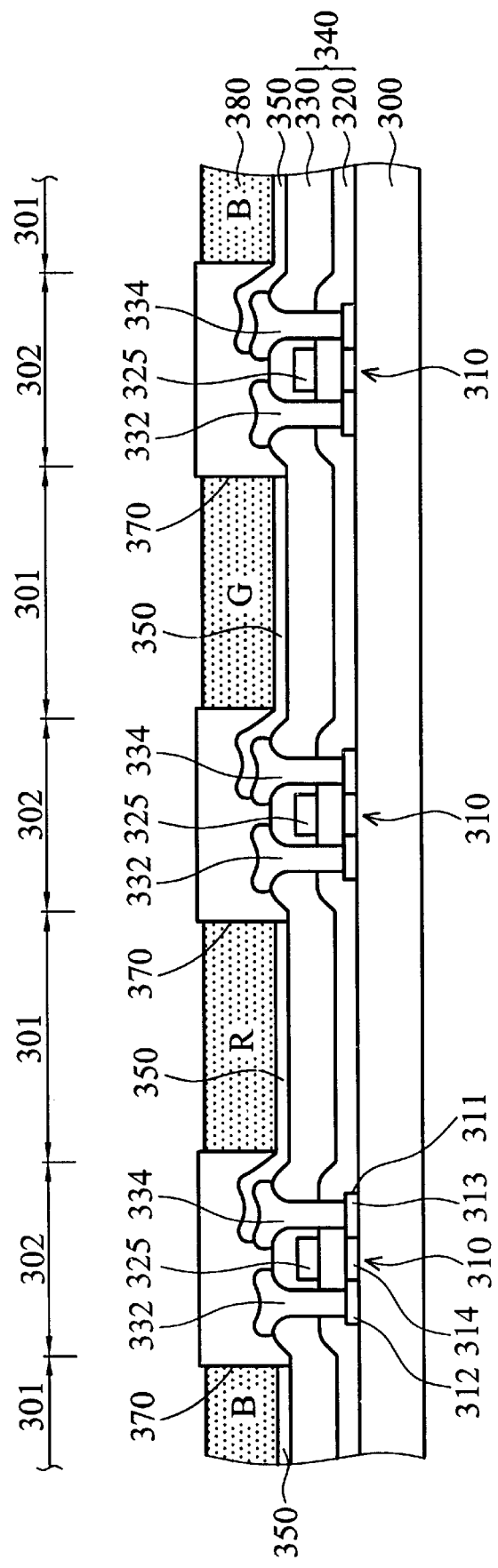

In FIG. 3D, an inkjet method is performed and at least one color pigment (also called color resist) is filled into the openings 370 to form a color filter 380 on the substrate 300 having the pixel driving elements 310 by, for example, nozzle(s). The colors of the color pigment can include red, green and blue. In this embodiment, it should be noted that when the planarization layer 360 is opaque, the color filter 380 includes red regions (R), green regions (G), blue regions (B) and a black matrix between the respective colors.

Figure 3E:
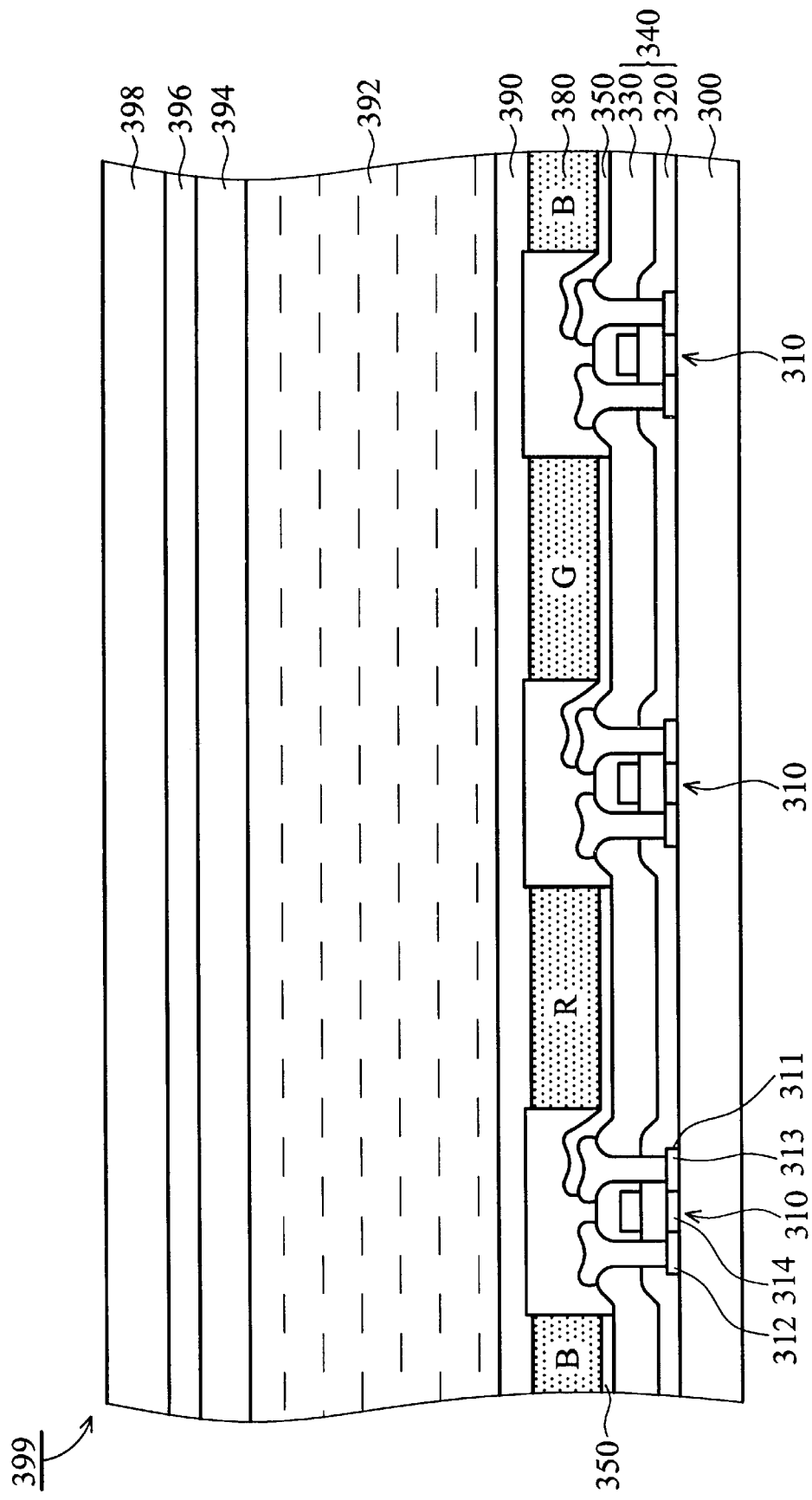

Moreover, a first orientation film 390 is formed on the color filter 380. Then, a transparent insulation substrate 398, such as glass, is provided. A common electrode 396 is formed on the inner side of the substrate 398. A second orientation film 394 is formed on the common electrode 396. Next, a liquid crystal layer 392 in which liquid crystal has been filled is formed between transparent insulation substrates 398 and 300 which face each other. That is, the liquid crystal layer 392 is sandwiched between the orientation films 394 and 390. Thus, a LCD apparatus 399 is obtained, as shown in FIG. 3E.

The present invention improves on the prior art in that the present method simultaneously forms the contact holes and the openings in the planarization layer, and then fills the color pigment into the openings to form an on-chip color filter.

As mentioned above, according to the present invention, the following effects can be obtained.

(1) Because the color filter adjoins the transparent pixel electrode, the coupling capacitor problem does not occur. Thus, the material selection of the planarization layer is easier than the prior art, thereby reducing costs.

(2) The planarization layer of the present invention can be transparent or opaque. When the planarization layer is opaque, the color filter of the present invention includes a black matrix.

(3) The present invention can use the inkjet method to fill color pigment(s) in the openings formed in the planarization layer without performing photolithography, there by simplifying the manufacturing process, and reducing costs.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming a color filter on a substrate having pixel driving elements, comprising the steps of:
    providing a substrate having a plurality of light-transmitting areas and active areas;
    forming a pixel driving element on the substrate in each active area, wherein an insulation layer is formed between each pixel driving element and on the substrate in the light-transmitting areas;
    forming a planarization layer on the pixel driving elements and the insulation layer; wherein planarization layer consists of organic high polymer
    removing part of the planarization layer to form a plurality of contact holes and openings, wherein the contact holes expose part of the surface of the pixel driving elements, and the openings expose the surface of the insulation layer in the light-transmitting areas;
    filling at least one color pigment into the openings to form a color filter on the substrate having the pixel driving elements; and
    forming transparent pixel electrodes in the contact holes to electrically connect the pixel driving elements, wherein the transparent electrodes extend onto part of the color filter.

2. The method according to claim 1, wherein the substrate is a glass substrate or a flexible substrate.

3. The method according to claim 1, wherein the pixel driving elements are thin film transistors (TFTs).

4. The method according to claim 1, wherein the insulation layer is a $SiO_2$ or SiN layer.

5. The method according to claim 1, wherein the planarization layer is transparent.

6. The method according to claim 1, wherein the color pigment is red, green or blue.

7. The method according to claim 1, wherein the transparent electrode is an indium tin oxide (ITO) layer.

8. A method of forming a color filter on a substrate having pixel driving elements, comprising the steps of:
    providing a substrate having a plurality of light-transmitting areas and active areas;
    forming a pixel driving element on the substrate in each active area, wherein an insulation layer is formed between each pixel driving element and on the substrate in the light-transmitting areas;
    forming an opaque planarization layer on the pixel driving elements and the insulation layer; wherein planarization layer consists of organic high polymer
    removing part of the planarization layer to form a plurality of contact holes and openings, wherein the contact holes expose part of the surface of the pixel driving elements, and the openings expose the surface of the insulation layer in the light-transmitting areas;
    filling at least one color pigment into the openings to form a color filter on the substrate having the pixel driving elements; and
    forming transparent pixel electrodes in the contact holes to electrically connect the pixel driving elements, wherein the transparent electrodes extend onto part of the color filter.

9. The method according to claim 8, wherein the substrate is a glass substrate or a flexible substrate.

10. The method according to claim 8, wherein the pixel driving elements are thin film transistors (TFTs).

11. The method according to claim 8, wherein the insulation layer is a $SiO_2$ or SiN layer.

12. The method according to claim 8, wherein the color pigment is red, green or blue.

13. The method according to claim 12, wherein the color filter comprises a red region, a green region, a blue region and a black matrix.

14. The method according to claim 1, wherein the transparent electrode is an indium tin oxide (ITO) layer.

* * * * *